United States Patent
Vallet

(12) 
(10) Patent No.: US 6,539,276 B1
(45) Date of Patent: Mar. 25, 2003

(54) SEMICONDUCTOR CIRCUIT HAVING SURFACE FEATURES AND METHOD OF ADJUSTING A TOOL WITH RESPECT TO THIS SURFACE

(75) Inventor: Michel Vallet, Vaulvaneys le Haut (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/407,507

(22) Filed: Sep. 28, 1999

(30) Foreign Application Priority Data

Sep. 30, 1998 (FR) ............................................ 98 12249

(51) Int. Cl.[7] .............................. G06F 19/00; G06F 9/45
(52) U.S. Cl. ........................ 700/186; 700/58; 700/121; 700/192; 716/7; 716/8; 716/21
(58) Field of Search ........................ 700/56, 121, 302, 700/303, 58, 114, 183, 186, 192; 257/629; 716/7, 8, 21

(56) References Cited

U.S. PATENT DOCUMENTS 4,720,635 A * 1/1988 Uga ............................ 250/548

* cited by examiner

Primary Examiner—Leo Picard
Assistant Examiner—Sheela S. Rao
(74) Attorney, Agent, or Firm—Lisa K. Jorgenson; Stephen Bongini; Fleit, Kain, Gibbons, Gutman & Bongini P. L.

(57) ABSTRACT

A semiconductor circuit that includes components and registration features that are electrically isolated from the components. The registration features form projecting parts that are uniformly distributed in the form of a matrix over at least part of the external surface of the circuit so as to define adjacent registration areas. In a preferred embodiment, the semiconductor circuit also includes metal registration features that are produced in at least one metallization level of the circuit. Also provided is a method of adjusting a tool so as to put it into a particular position with respect to the surface of a semiconductor circuit that has registration features defining adjacent registration areas. According to the method, an at least partial topographic record of the registration features on the surface of the semiconductor circuit is produced, and the registration features of the topographic record are brought into coincidence with reference features of a reference drawing. The reference features of the reference drawing correspond to the registration features of the circuit. The position of the tool is adjusted with respect to at least some of the reference features or registration features.

21 Claims, 4 Drawing Sheets

SEMICONDUCTOR CIRCUIT HAVING SURFACE FEATURES AND METHOD OF ADJUSTING A TOOL WITH RESPECT TO THIS SURFACE

CROSS-REFERENCE TO RELATED APPLICATIONS

This application is based upon and claims priority from prior French Patent Application No. 98-12249, filed Sep. 30, 1998, the entire disclosure of which is herein incorporated by reference.

BACKGROUND OF THE INVENTION

1. Field of the Invention

The present invention relates to semiconductor circuits, and more specifically to a semiconductor circuit having surface features.

2. Description of Related Art

When fabricating prototype semiconductor circuits and when fabricating semiconductor circuits on a production line, electrical tests are performed to detect and locate possible faults in the structure of the semiconductor circuits being tested. In particular, such faults can include imperfectly produced components and missing or erroneous electrical connections between components. When the position of a fault in the structure is located, there is a need to physically examine the semiconductor component being tested and the discovered fault or faults and, optionally, to carry out a repair.

For this purpose, there are machines that have a chamber into which the tested semiconductor circuit can be placed. Such machines also include tools for carrying out examination and/or intervention operations (such as focused ion beam (FIB) tools and electron beam (EB) testers) to modify or adapt the semiconductor circuit fabrication processes. Additionally, the machines are equipped with an electronic navigation system that allows the operator to produce a topographic record of the projecting parts on the upper surface of the tested semiconductor circuit that result from the final layer of the components of the circuit.

The navigation system can bring the image of this topographic record into coincidence with an image of a reference drawing for this topography that is contained in a database. After producing the image and then superimposing the two images, the operator can adjust the tool with respect to the surface of the semiconductor circuit so as to bring it into a chosen position by taking as a reference that image of the reference drawing associated with the position of the tool. The chosen position typically corresponds to the location of a fault that was discovered during the electrical test.

However, such a procedure has limitations that become more critical as the internal components of the semiconductor circuits are moved closer and closer together. More specifically, if the external surface of the semiconductor layer has projecting parts that are relatively close to each other, the tool can be positioned with relatively high precision. However, if the external surface of the tested semiconductor circuit has projecting parts that are relatively far apart, positioning difficulties are encountered, especially with regard to the orientation of the semiconductor circuit with respect to the reference drawing.

Further, the positioning operation becomes almost impossible when the external surface of the tested semiconductor circuit has few or no projecting parts. For example, memory circuits only rarely have more than just two projecting peripheral strips for the electrical supplies on their external surface. In such a case, it is necessary to use a tool of the machine to bare at least two local parts of an internal layer of the semiconductor circuit (e.g., a metallization layer) in the region of the location that is to be explored by removing the upper layers.

This allows a topographic record of the exposed parts to be made and brought into coincidence with an image of the reference drawing of this internal layer from the database. Then, the tool may be adjusted with respect to the reference drawing in correspondence with the topographic record. During these processes, the operations carried out to position the tool with respect to the external surface of the semiconductor circuit are relatively tedious and can turn out to be imprecise. Thus, any work carried out locally on the tested semiconductor circuit may not be at the proper location and this can lead to an ultimate deterioration of the tested circuit.

SUMMARY OF THE INVENTION

In view of these drawbacks, it is an object of the present invention to overcome the above-mentioned drawbacks and to provide a semiconductor circuit and a method of adjusting a tool with respect to the semiconductor circuit to facilitate such adjustment.

One embodiment of the present invention provides a semiconductor circuit that includes components and registration features that are electrically isolated from the components. The registration features form projecting parts that are uniformly distributed in the form of a matrix over at least part of the external surface of the circuit so as to define adjacent registration areas. In a preferred embodiment, the semiconductor circuit also includes metal registration features that are produced in at least one metallization level of the circuit.

Another embodiment of the present invention provides a method of adjusting a tool so as to put it into a particular position with respect to the surface of a semiconductor circuit that has registration features defining adjacent registration areas. According to the method, an at least partial topographic record of the registration features on the surface of the semiconductor circuit is produced, and the registration features of the topographic record are brought into coincidence with reference features of a reference drawing. The reference features of the reference drawing correspond to the registration features of the circuit. The position of the tool is adjusted with respect to at least some of the reference features or registration features. In one preferred method, the registration features form a plurality of projecting parts that are uniformly distributed in the form of a matrix over at least part of the external surface of the circuit so as to define a plurality of adjacent registration areas, and the position of the tool is adjusted with respect to at least some of the adjacent reference or registration features that define the registration area of the circuit in which the position lies.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
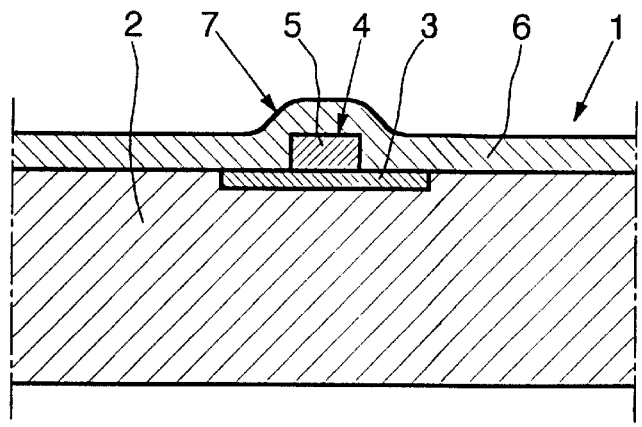
FIG. 1 shows a partial cross-section of a semiconductor circuit according to a preferred embodiment of the present invention.
Figure 2:
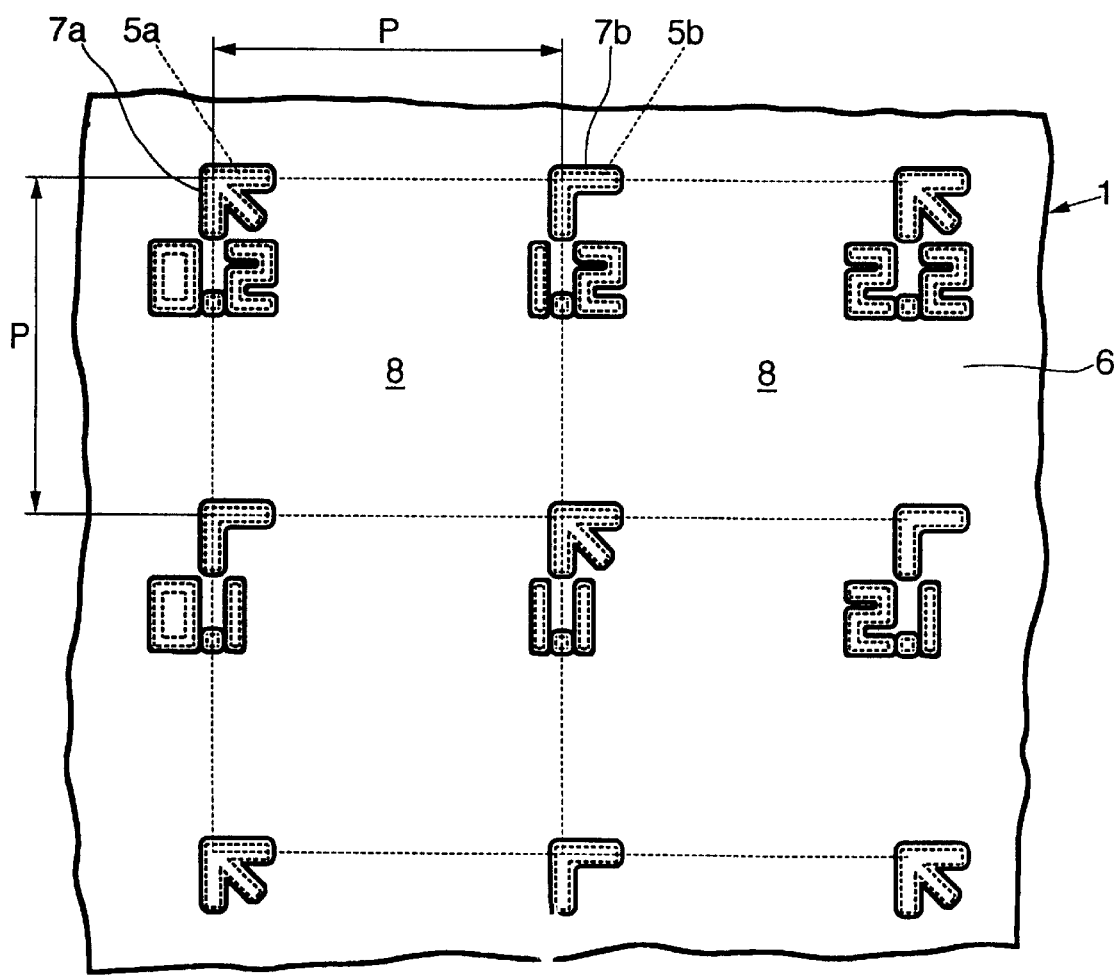
FIG. 2 shows a partial top view of the semiconductor circuit of FIG. 1.

FIGS. 1 and 2 show a semiconductor circuit 1 having a flat insulation or oxide layer 3 above its volume 2 in which electronic components are produced. On the flat insulating layer 3, the circuit 1 has a final metallization level 4 with multiple metal registration features 5 that are electrically isolated from the electronic components of the circuit 1. The circuit 1 also includes a protective insulating external layer 6 located over its entire surface to cover the insulating layer 3 and the metallization layer 4. Preferably, the thickness of the external layer 6 is approximately constant so as to form multiple projecting parts forming registration features 7 above the metal registration features 5.

In the illustrated embodiment, the metal features 5 corresponding to the projecting registration features 7 are arranged uniformly at a certain distance from each other in the form of a square matrix. This defines multiple adjacent registration areas 8 on the surface of the circuit, with each area being bounded at its corners by four adjacent features. According to a preferred embodiment, the pitch P in the horizontal and vertical directions of the metal features 5 (and consequently of the registration features 7) is equal to a multiple of a pitch of the internal structure of at least some of the electronic components of the circuit 1. For example, this pitch can be equal to 30 microns.

Additionally, in the illustrated embodiment, the metal features 5, and consequently the corresponding projecting registration features 7, are formed alternately of arrows 5a and 7a and legs 5b and 7b, which indicate a common direction (e.g., at 45°) with respect to the matrix. Preferably, the width of the arms forming the metal registration features 5 is as small as possible. For example, the width can be equal to approximately half of a micron, and the length of the arms can be equal to approximately three microns.

The metal features 5 and the associated registration features 7 also include different registration numbers (e.g., numbers that increase along the horizontal direction and along the vertical direction of the matrix so as to form graduated scales). If the insulating layer 3 of the circuit 1 is flat, it is particularly advantageous to provide metal features 5 and associated registration features 7 over the entire surface. In embodiments in which the circuit 1 also has components in the final metallization layer 4 that are produced at the same time as the metal features 5, it is advantageous to provide the metal features 5 and the associated registration features in flat areas of the insulating layer 3.

Figure 3:
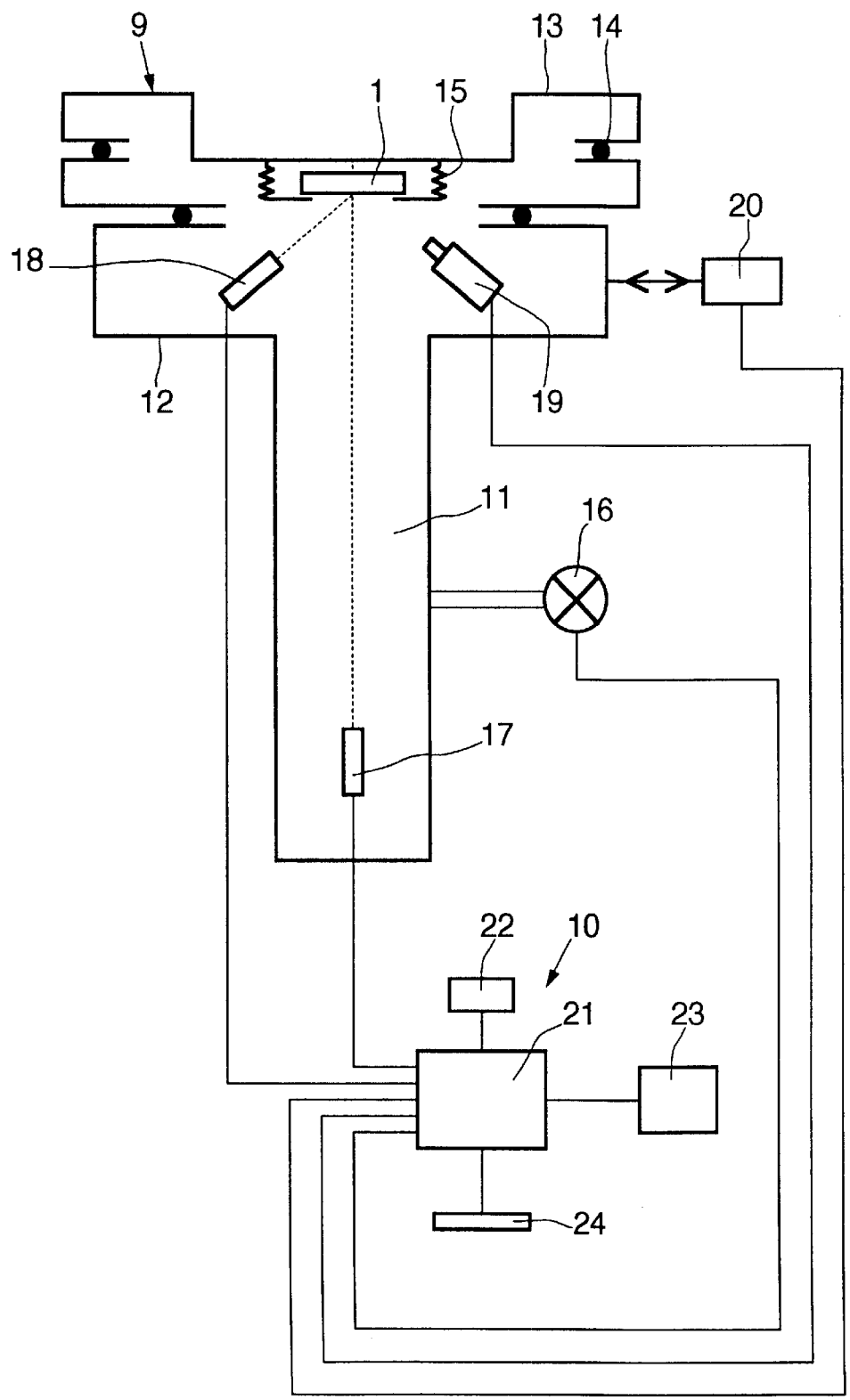
FIG. 3 shows a diagram of a machine for testing and repairing semiconductor circuits.

FIG. 3 shows a testing and repair machine 9 that is connected to a conventional electronic navigation system 10. The machine 9 has a vertical chamber 11 that is bounded by a lower casing 12 and a cover 13 resting on the casing 12 via a seal 14. The cover 13 is provided with conventional means 15 for holding a semiconductor circuit 1 in the chamber 11 by its edges, and the chamber 11 is connected to a vacuum pump 16. A tool consisting of a high-energy ion-beam emitter 17 (e.g., a gallium source) is placed in the lower part of the chamber 11 so as to emit upwards towards the circuit 1.

Another tool consisting of a detector 18 is provided in the upper part of the chamber 11 and placed laterally at 45° to the circuit 1. The detector is used to detect the secondary ions or electrons emitted by the circuit 1 under the effect of the beam from the emitter 17. Also provided in the upper part of the chamber 11 is a system of gas injection nozzles 19 that are placed laterally and oriented at 45° to the circuit 1. The system of nozzles 19 is used to selectively inject an oxide-edging gas, a metaletching gas, a metal-depositing gas, and an oxide-depositing gas into the chamber 11. The emitter 17, the detector 18, and the nozzle 19 are supported by the casing 12, and the casing 12 can move horizontally with respect to the cover 13 by the action of motors 20.

The electronic navigation system 10 includes a computer 21 having a database 22, a connected display screen 23, and a connected input means 24 (e.g., a keyboard and/or a mouse). The computer 21 is connected for controlling the pump 16, the emitter 17, the detector 18, the system of nozzles 19, and the motors 20. An operator can use the electronic navigation system 10 to scan the surface of the semiconductor circuit 1 placed in the chamber 11 of the machine 9 with the beam emitted from the emitter 17 so as to produce a topographic record of the surface and display the topographic record on the screen 23. The topographic record (such as the record 25 illustrated in FIG. 4) reveals the projecting registration features 7. The operator can also display on the screen 23 a drawing of the metal registration features 5 of the semiconductor circuit 1 that is stored in the database 22 (such as the drawing 26 illustrated in FIG. 4).

Figure 4:
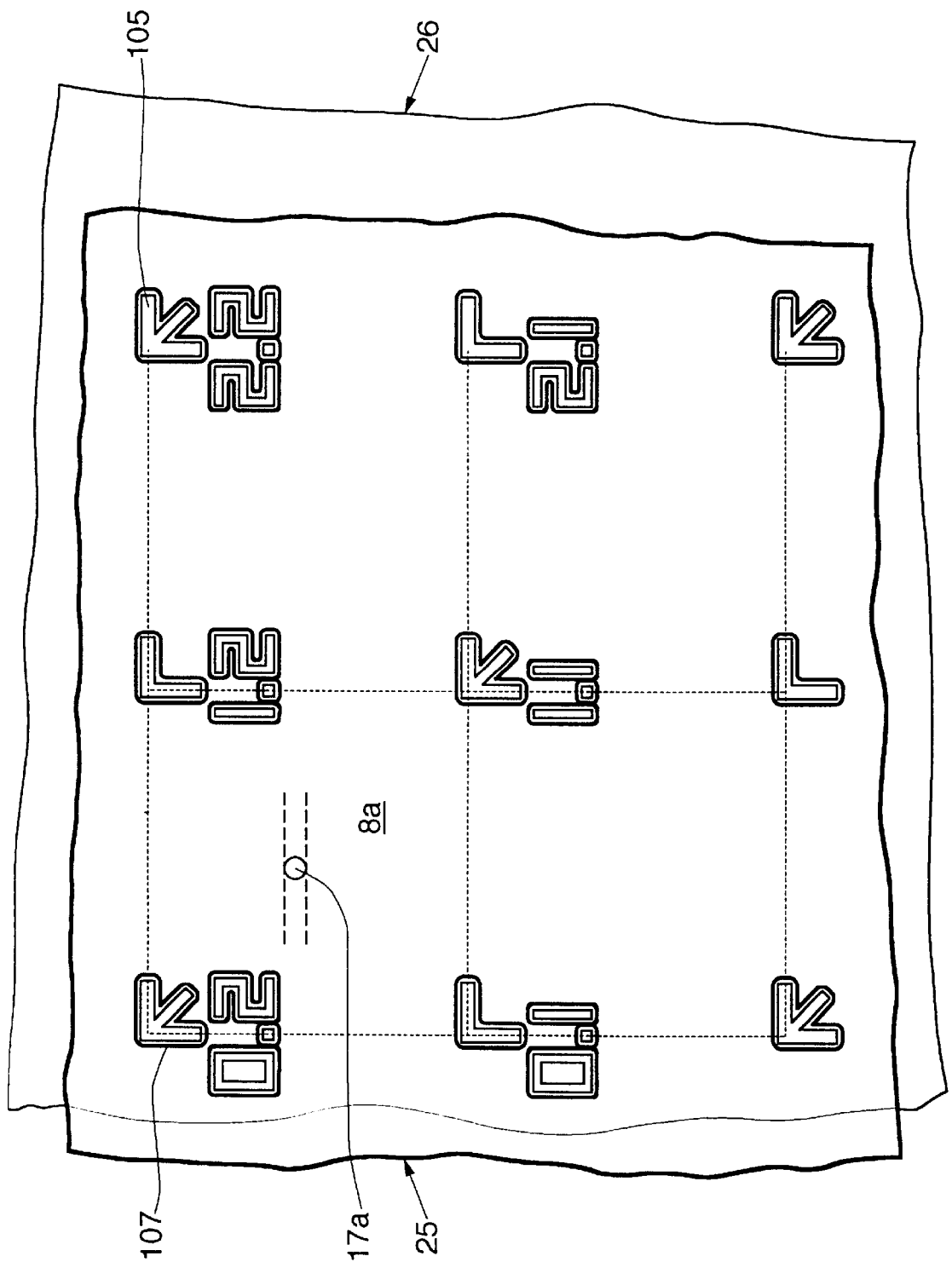
FIG. 4 shows an image visible on the electronic navigation system of the machine of FIG. 3.

As shown in FIG. 4, the operator brings the features 105 of the drawing 26 and the shapes 107 of the topographic record 25 into coincidence with each other. This is facilitated by the fact that the registration features 7 are oriented and have registration numbers. After bringing the two into coincidence with one another, the operator can place the beam from the emitter 17 in any particular position with respect to the surface of the semiconductor circuit 1 by moving the casing 11 with respect to the cover 13 through the action of the motors 20. This is because the position of the casing is slaved to the drawings displayed on the screen in accordance with the program in the computer 21, and the position of the beam from the emitter 17 is also displayed on the screen 23.

Figure 5A:
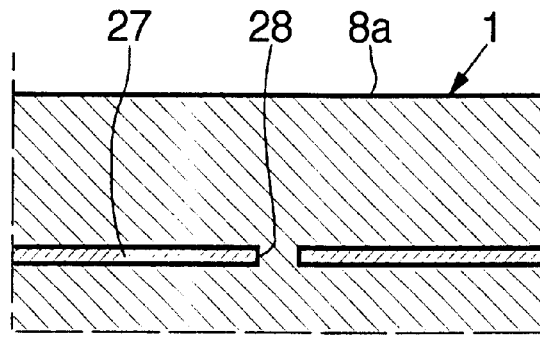
FIGS. 5a through 5d show a method for carrying out work on a semiconductor circuit according to an embodiment of the present invention.

In an example shown in FIG. 5a, a semiconductor circuit 1 has a metal strip 27 in its volume 2, and the strip has a defect or a fault consisting of an undesirable break 28. The fault is detected beforehand in an electrical test of the circuit 1 and is located in a particular registration area 8a that is bounded by four particular numbered adjacent registration features 7. The operator can instruct the computer 21 to operate the machine 9 so as to position the emitter 17 with respect to the surface of the semiconductor circuit 1 at 17a, which is exactly vertically in line with the fault 28.

Figure 5B:
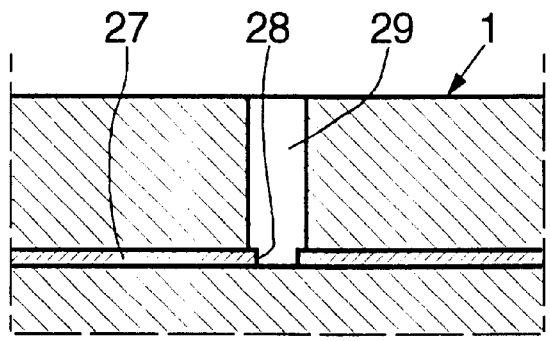
Figure 5C:
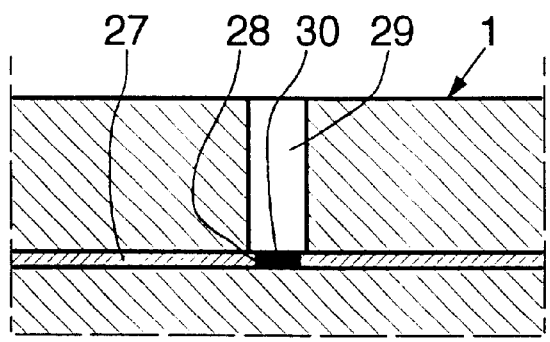
Figure 5D:
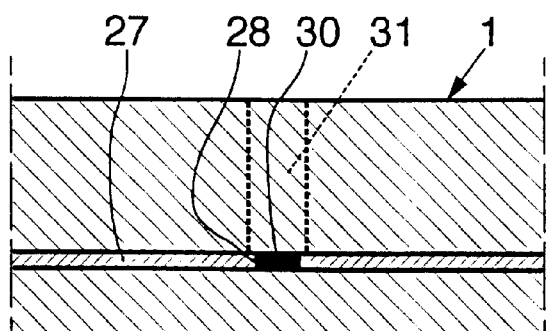

This positioning is made possible by using the four features of the registration area 8a as adjustment reference. The operator can then program the computer 21 such that it operates the machine 9 so as to produce a hole 29 in the semiconductor circuit 1 until the fault 28 is exposed, as shown in FIG. 5b. Metal 30 is then deposited at the bottom of the hole 29 to connect the two arms of the metal strip 27, as shown in FIG. 5c, and then the hole 29 is filled, as shown in FIG. 5d.

Accordingly, the provision of the projecting registration features on the surface of the semiconductor circuit makes it possible for the machine to be precisely adjusted with respect to the surface of the circuit put into the chamber. Thus, precise localized work can be carried out regardless of the internal structure of the components of the semiconductor circuit.

Of course, this illustrative example described with reference to FIGS. 5a through 5d is not meant to be limiting. The operator could also use the machine 9 and the electronic navigation system 10 to carry out other repair operations, such as the updating and display on the screen 23 of any internal shapes of the components of the semiconductor circuit 1, the repair of any missing horizontal or vertical connections, or the removal of connections that should not exist inside the components of the semiconductor circuit 1. Furthermore, the metallization level being operated on could be an intermediate metallization level intended to be subsequently covered by other metallization levels, in which metal registration features could also be provided, preferably superimposed on the metal registration features.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method of adjusting a tool so as to put it into a particular position with respect to a surface of a semiconductor circuit that has a plurality of registration features electrically isolated from the components of the circuit, said method comprising the steps of:

producing an at least partial topographic record of the registration features on the surface of the semiconductor circuit, the registration features forming a plurality of projecting parts that are uniformly distributed in the form of a graduated matrix over at least part of the surface of the circuit so as to define a plurality of adjacent registration areas on the surface of the circuit;

determining an adjustment position for the tool with respect to at least one of the registration features of the graduated matrix, the at least one registration feature defining the registration area that includes the adjustment position;

bringing the at least one registration feature of the graduated matrix of the topographic record into coincidence with at least one reference feature of a reference drawing for at least part of the circuit, the reference features of the reference drawing corresponding to the registration features of the circuit; and adjusting the position of the tool using the at least one registration feature defining the registration area that includes the adjustment position as adjustment reference, so as to bring the tool to the adjustment position.

2. The method as defined in claim 1, wherein the registration features are metal registration features that are covered with an external insulating layer that follows the profile of the metal registration features.

3. The method as defined in claim 1, wherein the tool is navigated with respect to the surface of the circuit by using an electronic navigation system.

4. The method as defined in claim 1, wherein the registration features on the surface of the semiconductor circuit include different registration numbers so at to form graduated scales of the graduated matrix.

5. The method as defined in claim 1, wherein the step of determining an adjustment position for the tool is performed after the registration features of the topographic record are brought into coincidence with the reference features of the reference drawing.

6. A method of adjusting a tool so as to put it into a particular position with respect to a surface of a semiconductor circuit that has a plurality of registration features electrically isolated from the components of the circuit, said method comprising the steps of:

producing an at least partial topographic record of the registration features on the surface of the semiconductor circuit, the registration features forming a plurality of projecting parts that are uniformly distributed in the form of a graduated matrix over at least part of the surface of the circuit so as to define a plurality of adjacent registration areas on the surface of the circuit;

determining an adjustment position for the tool with respect to at least one reference feature of a reference drawing for at least part of the circuit, the reference features of the reference drawing corresponding to the registration features of the circuit and the at least one reference feature defining the registration area that includes the adjustment position;

bringing the at least one reference feature of the reference drawing into coincidence with at least one registration feature of the graduated matrix of the topographic record; and adjusting the position of the tool using the at least one reference feature defining the registration area that includes the adjustment position as adjustment reference, so as to bring the tool to the adjustment position.

7. The method as defined in claim 6, wherein the registration features are metal registration features that are covered with an external insulating layer that follows the profile of the metal registration features.

8. The method as defined in claim 6, wherein the tool is navigated with respect to the surface of the circuit by using an electronic navigation system.

9. The method as defined in claim 6, wherein the registration features on the surface of the semiconductor circuit include different registration numbers so at to form graduated scales of the graduated matrix.

10. The method as defined in claim 6, wherein the step of determining an adjustment position for the tool is performed after the reference features of the reference drawing are brought into coincidence with the registration features of the topographic record.

11. A method of adjusting a tool so as to put it into a desired position, said method comprising the steps of:

providing a semiconductor circuit that includes a plurality of registration features electrically isolated from components of the circuit, the registration features forming a plurality of projecting parts that are uniformly distributed in the form of a graduated matrix over at least part of the surface of the circuit so as to define a plurality of adjacent registration areas on the surface of the circuit; and adjusting the position of the tool using as adjustment reference at least one of the registration features defining the registration area that includes the desired position for the tool, so as to bring the tool to the desired position.

12. The method as defined in claim 11, wherein the registration features are metal registration features that are produced in at least one metallization level of the circuit.

13. The method as defined in claim 12, wherein the metal registration features are produced in at least two metallization levels and superimposed.

14. The method as defined in claim 12, wherein the metal registration features are covered with an external insulating layer that follows the profile of the metal registration features.

15. The method as defined in claim 11, wherein the registration features are alternately of different shape.

16. The method as defined in claim 11, wherein a pitch of the registration features is equal to a multiple of a pitch of at least some of the components of the circuit.

17. The method as defined in claim 11, wherein the registration features on the surface of the semiconductor circuit include different registration numbers so at to form graduated scales of the graduated matrix.

18. The method as defined in claim 11, wherein at least some of the registration features have shapes that indicate a common direction.

19. A machine-readable medium encoded with a program for controlling at least one machine to adjust a tool so as to put it into a particular position with respect to a surface of a semiconductor circuit that has a plurality of registration features electrically isolated from the components of the circuit, said program containing instructions for performing the steps of:

producing an at least partial topographic record of the registration features on the surface of the semiconductor circuit, the registration features forming a plurality of projecting parts that are uniformly distributed in the form of a graduated matrix over at least part of the surface of the circuit so as to define a plurality of adjacent registration areas on the surface of the circuit;

determining an adjustment position for the tool with respect to at least one of the registration features of the graduated matrix, the at least one registration feature defining the registration area that includes the adjustment position;

bringing the at least one registration feature of the graduated matrix of the topographic record into coincidence with at least one reference feature of a reference drawing for at least part of the circuit, the reference features of the reference drawing corresponding to the registration features of the circuit; and adjusting the position of the tool using the at least one registration feature or reference feature defining the registration area that includes the adjustment position as adjustment reference, so as to bring the tool to the adjustment position.

20. The machine-readable medium as defined in claim 19, wherein the registration features are metal registration features that are covered with an external insulating layer that follows the profile of the metal registration features.

21. The machine-readable medium as defined in claim 19, wherein the tool is navigated with respect to the surface of the circuit by using an electronic navigation system.

\* \* \* \* \*